United States Patent [19]

Kotzan et al.

[11] Patent Number: 5,438,219

[45] Date of Patent: Aug. 1, 1995

[54] DOUBLE-SIDED OSCILLATOR PACKAGE AND METHOD OF COUPLING COMPONENTS THERETO

[75] Inventors: Mark E. Kotzan, Arlington Heights; Thomas A. Knecht, Algonquin, both of Ill.

[73] Assignee: Motorola, Inc., Schaumburg, Ill.

[21] Appl. No.: 160,008

[22] Filed: Nov. 30, 1993

[51] Int. Cl.⁶ .................. H01L 25/16; H01L 23/52; H01L 23/04

[52] U.S. Cl. .................. 257/469; 257/723; 257/724; 257/698

[58] Field of Search .......... 257/723, 724, 690, 698, 257/678, 469, 700, 467, 532, 924, 659, 660

[56] References Cited

U.S. PATENT DOCUMENTS

| | | | |
|---|---|---|---|
| 3,239,719 | 3/1966 | Shower | 257/778 |
| 3,969,640 | 7/1976 | Staudte | 310/9.1 |
| 4,768,077 | 8/1988 | Scherer | 257/671 |
| 4,999,699 | 3/1991 | Christie et al. | 257/778 |
| 5,124,782 | 6/1992 | Hundt et al. | 257/724 |
| 5,208,504 | 5/1993 | Parker et al. | 310/313 R |

FOREIGN PATENT DOCUMENTS

| | | | |
|---|---|---|---|
| 0074659 | 4/1985 | Japan | 257/724 |
| 0100959 | 4/1989 | Japan | 257/724 |
| 0130670 | 5/1992 | Japan | 257/419 |

Primary Examiner—William Mintel
Assistant Examiner—Peter Toby Brown
Attorney, Agent, or Firm—Gary J. Cunningham

[57] ABSTRACT

A double-sided oscillator package and method of coupling components thereto. A package 100 having an open-top receptacle adapted to receive electronic components and an open-bottom receptacle 114 adapted to receive a piezoelectric element and a cover 116 for hermetically sealing the open-bottom receptacle 114. The electronic components and piezoelectric element are electrically connected. A hermetic environment 118 is established by coupling the cover 116 and open-bottom receptacle 114.

12 Claims, 3 Drawing Sheets

DOUBLE-SIDED OSCILLATOR PACKAGE AND METHOD OF COUPLING COMPONENTS THERETO

The present invention relates generally to frequency control devices and, in particular, to a double-sided oscillator package and method of coupling components thereto.

BACKGROUND OF THE INVENTION

Frequency control devices are known to include temperature-compensated crystal oscillators (TCXO). A typical TCXO utilizes a piezoelectric material and temperature compensation circuitry to provide a reliable and stable oscillator output, for example, for high frequency wave forms under varying environmental conditions. These devices are commonly found in portable radio frequency (RF) communication equipment, such as cellular telephones, pagers and wireless modems. As consumer demand continually drives down the size of cellular telephones and other communications equipment, the need for TCXO's having smaller dimensions and reduced weight has become even greater.

FIG. 1 is a perspective view of a prior art TCXO 10. The TCXO 10 includes a piezoelectric element 12, temperature compensation circuitry in the form of an integrated circuit (IC) 14 and chip capacitors 16, input/output pads (not shown), and a device lid 18. A hermetically sealed environment 20 is formed when the lid 18 and housing 22 are attached.

When a voltage is applied across the piezoelectric element 12, the element 12 resonates at a certain oscillator output. The resonant frequency of the piezoelectric element can change or drift about a nominal frequency, responsive to the changes of temperature in the housing 22. Typically, a temperature sensing device which could be included in the IC provides information to the temperature compensation circuitry regarding the environment 20. As the temperature within the environment 20 fluctuates, the temperature compensation circuitry suitably modifies circuit parameters to minimize frequency drift in the oscillator output.

The height, width and depth of the TCXO 10 are dependent upon the piezoelectric element, temperature compensation circuitry, integrated circuit 14 and chip capacitors 16 in the housing 22. That is, the overall size of the housing 22 and lid add to the overall dimensions of the TCXO 10. Typical dimensions for the TCXO 10 are about 8.89 mm $\times$ 8.89 mm $\times$ 2.79 mm.

While these dimensions may appear to be small, the demand for smaller cellular telephones and other electronic products necessitates TCXO's having even smaller physical dimensions. Therefore, a substantial need for frequency control devices which overcome prior art dimensional limitations, and which meet or exceed the appropriate performance requirements or criteria of their larger counterparts are needed.

There is also a need for: (i) a package or housing for frequency control devices which allows the piezoelectric element to be housed separately or to be isolated from the other components without sacrificing space, to minimize the possibility of cross-contamination of the components; and (ii) a mass producable package which can simplify frequency tuning and hermetic sealing.

DESCRIPTION OF A PREFERRED EMBODIMENT

The present invention provides an improved double-sided temperature compensated crystal oscillator (TCXO) package 100. This package 100 includes generally a compensation circuit, having temperature-sensitive components, coupled to a substrate. The package 100 is adapted to receive a piezoelectric element mounted onto a portion of the package 100, such that an electrical connection is provided between the compensation circuit and the piezoelectric element to produce an untuned frequency controlled device. After frequency tuning, a hermetic seal is provided around the piezoelectric element. With the package 100 of this invention, the dimensional limitations of the prior art frequency control devices are substantially overcome.

Figure 1:
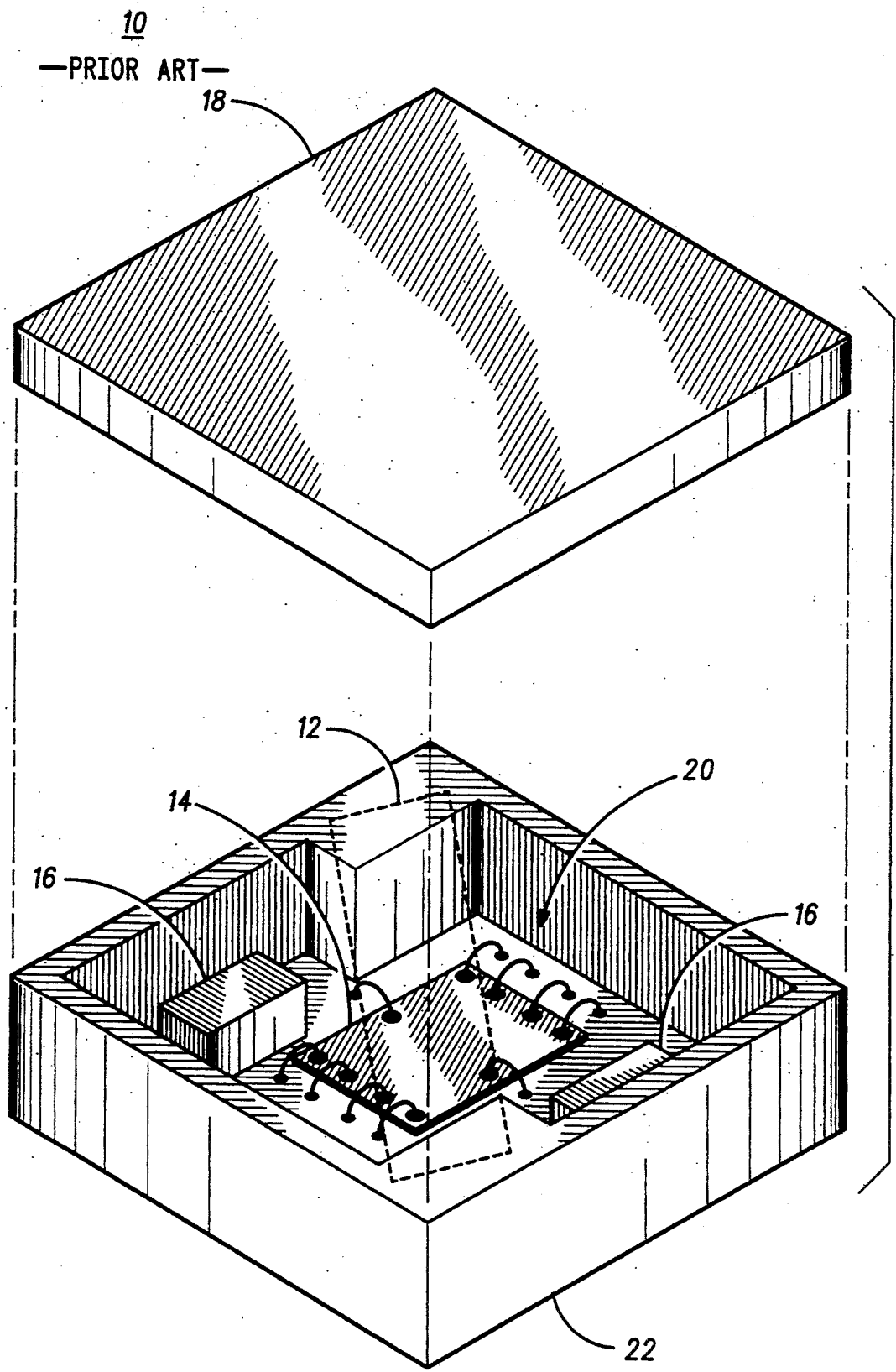
FIG. 1 illustrates a perspective view of a prior art TCXO.
Figure 2:
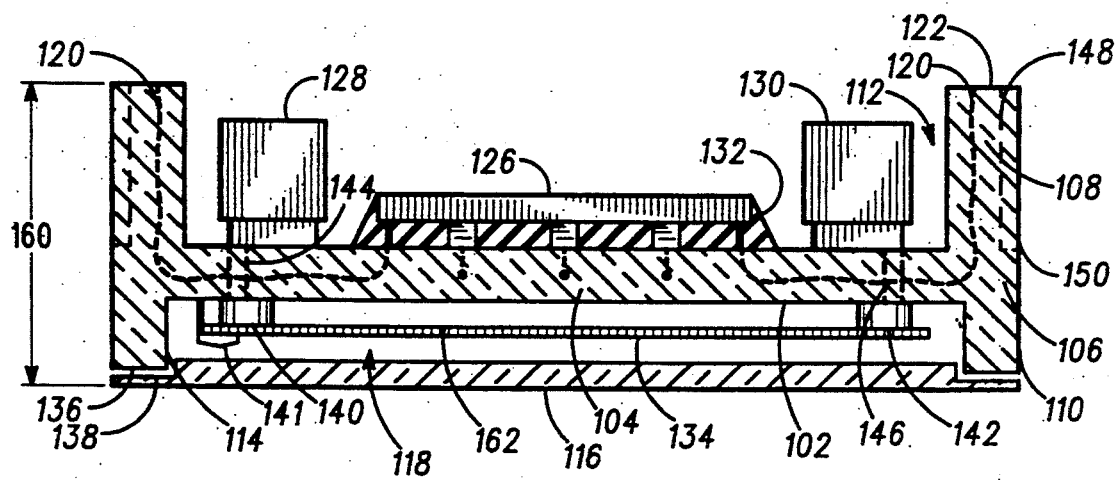
FIG. 2 illustrates an enlarged cross-sectional view of a double-sided temperature compensated crystal oscillator package in accordance with the present invention.
Figure 3:
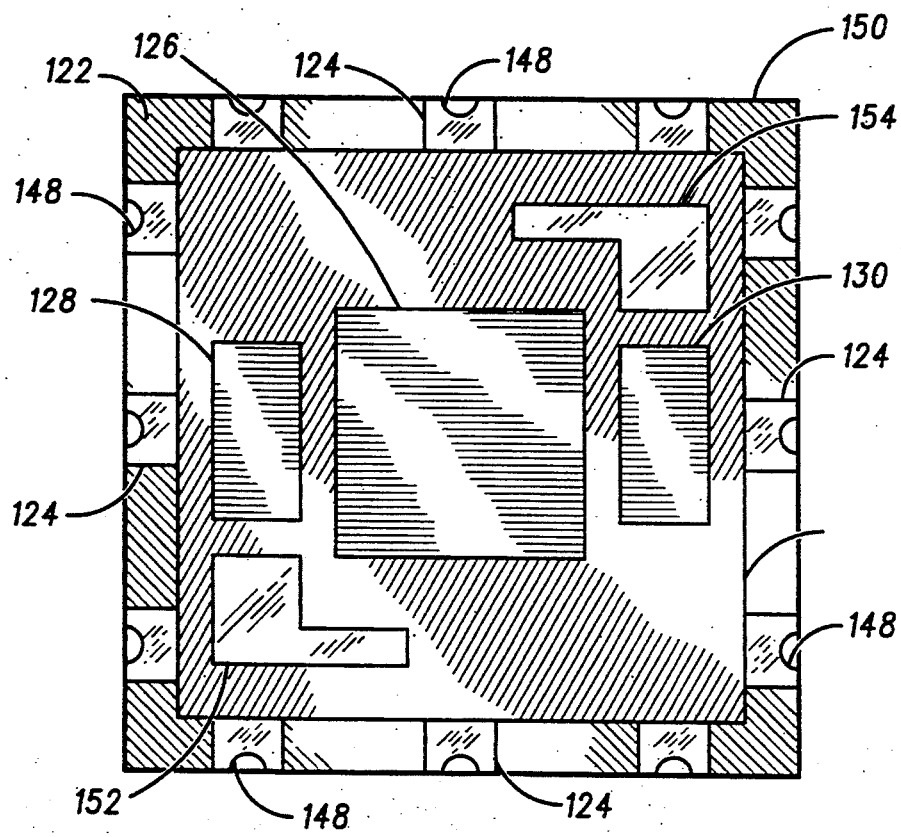
FIG. 3 illustrates an enlarged top view of the double-sided oscillator package in accordance with the present invention.

The present invention can be more fully described with reference to FIGS. 2–4. FIG. 2 shows the package 100 in its simplest form. The package 100 includes a substantially planar platform 102 including a central portion 104, and an outer portion 106. Extending substantially upwardly and downwardly from the outer portion 106 of the platform 102, are upper and lower sidewalls 108 and 110. The upper sidewall 108 and the platform 102 form a substantially rectangular, open top receptacle 112 adapted to receive electronic components. Similarly, the lower sidewall 110 and the platform 102 form an open-bottom receptacle 114 adapted to receive at least one piezoelectric component, such as a piezoelectric element 134. A cover 116 is attached to the open-bottom receptacle 114 to provide a hermetic environment 118 defined by the open-bottom receptacle 114 and cover 116. The platform 102 helps to isolate the receptacles 112 and 114 and components therein, thereby: minimizing the possibility of contamination after assembly or during tuning; and providing a hermetically sealed piezoelectric device 134 which can be processed separately from the electronic components in the open-top receptacle 112, without sacrificing size, integrity or cost. Only one cover 116 is required to achieve this.

The package 100 geometry can vary widely. In one embodiment, the package 100 is substantially portable and rectangular or square, and is adapted for placement in an electronic device taking up an extremely small volume of the overall volume of the electronic device.

The package 100 is particularly adapted for mass production and miniaturization. For example, the package can have the dimensions of 7.11 mm $\times$ 6.22 mm $\times$ 2.24 mm, identified as the length, width and height 156, 158 and 160 in FIGS. 2 and 4.

In a preferred embodiment, the package 100 comprises materials having substantially similar thermal expansion coefficients, to minimize stresses within the package. In one embodiment, the open-top receptacle 112 comprises the platform 102 and the upper sidewalls 108 both made of a co-fired ceramic material, such as alumina. The lower sidewall 110 can comprise an alloy of nickel, iron and cobalt, Kovar, or Alloy 42, and the like, preferably Kovar because of its coefficient of thermal expansion being substantially similar to the ceramic material making the platform 102 and open-top receptacle 112.

A plurality of internal leads 120 (shown as dashed lines in FIG. 2) are included for coupling the electrical components and piezoelectric element 134 to electrical signals for actuating the components in package 100. Referring to FIGS. 2 and 3, the plurality of leads 120 are coupled to a plurality of respective contacts 124, positioned on an upper-end portion 122. Preferably, the upper-end portion 122 is substantially planar for providing a good contact to a circuit board to which it will be connected. The internal leads 120 are formed in the platform 102 and upper sidewalls 108. Thus, the plurality of conductive leads or paths 120 extend from the central portion 104 to the upper-end portion 122, with each lead being insulated from its adjacent lead. The leads 120 provide electrical paths from the circuitry to the end portion 122, and include co-fired vias within the ceramic itself, or can include plated half holes, called castellations on the outside of the upper side walls 108.

The open-top receptacle 112 includes electronic components and the open-bottom receptacle 114 includes at least a piezoelectric element 134. More particularly, the open-top receptacle 112 includes a temperature compensation integrated circuit (IC) 126 and chip capacitors 128 and 130, securely coupled to the central portion 104 of the platform 102. The IC 126 can include any suitable IC, for example, a wire bonded IC including a glob top, a flip chip IC including an organic underfill or the like. In a preferred embodiment, the IC 126 is a flip chip IC including an organic underfill 132 for a secure coupling of the IC 126 to the central portion 104 of the platform 102 and for minimizing contamination to the IC 126.

The IC 126 is solder reflowed onto a metallized portion in proximity to the central portion 104 of the platform. This forms the electrical and mechanical connection of the IC 126 and platform 102.

The open-top receptacle 112 also includes sufficient space for conductive pads 152 and 154 adapted for tuning the piezoelectric element 134, and first and second chip capacitors 128 and 130 which typically function as DC voltage bypass capacitors. The IC 126 itself supplies the temperature compensation function.

The open-bottom receptacle 114 includes at least the piezoelectric element 134 and can include other components if desired. The piezoelectric element 134 can vary widely. Examples can include quartz, AT-cut quartz strip and the like. In a preferred embodiment, the piezoelectric element 134 comprises an AT-cut quartz strip for a well-behaved frequency versus temperature relationship from about −40° C. to about 90° C., that is temperature compensatible. Having the piezoelectric element 134 isolated from the other components minimizes the possibility of contaminating the piezoelectric element 134, resulting in undesirably altering its frequency.

More particularly, isolating and physically separating the piezoelectric element 134 in the open-bottom receptacle 112 from the components in the open-top receptacle 112, substantially minimizes the possibility of the solder, organic underfill, and other unwanted contaminants from adversely affecting the output frequency of the piezoelectric element 134, which can occur over time in prior art TCXO's.

The cover 116 is complimentary configured to be received and coupled to the open-bottom receptacle 114, and specifically to a lower-end portion 136. The cover 116 can be seam welded or solder sealed to the lower sidewalls 110, and preferably to the lower-end portion 136 for providing a good hermetic seal.

More particularly, the lower end portion 136 and an outer periphery 138 of cover 116 are complimentary configured to provide a secure interconnection and seal of the contents in the open-bottom receptacle 114 and environment 118. In one embodiment, the cover 116 is metal and coupled to a ground portion of the IC 126.

Figure 4:
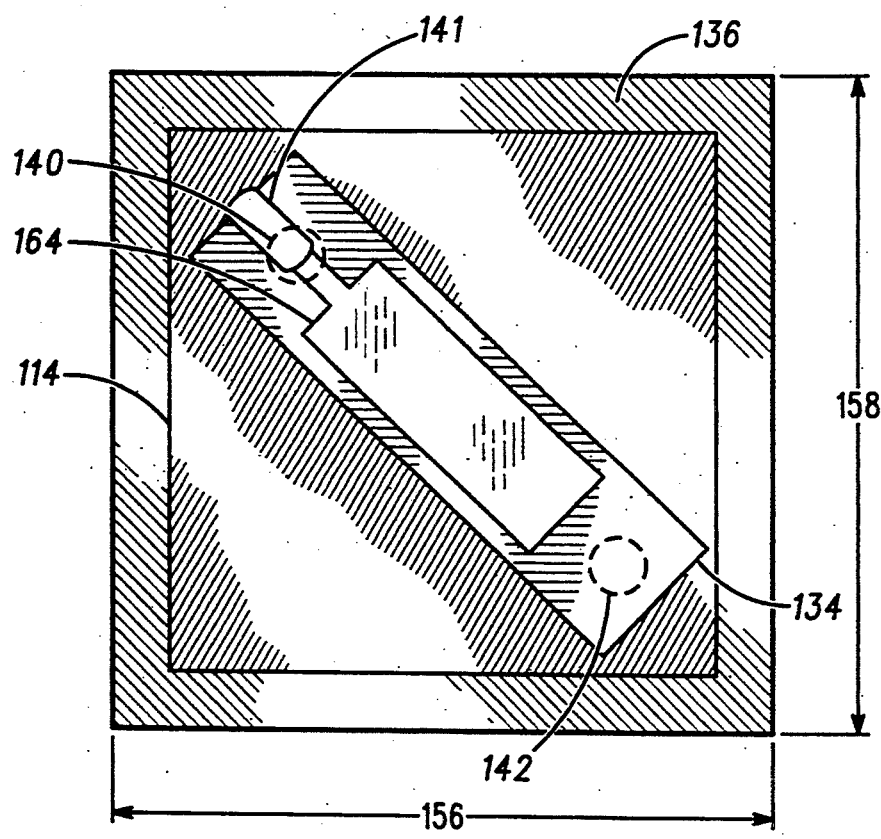
FIG. 4 illustrates an enlarged bottom view of the double-sided oscillator package in accordance with the present invention.

Referring to FIGS. 2 and 4, the piezoelectric element 134 is positioned on and coupled to couplings 140 and 142. The couplings 140 and 142 provide mechanical and electrical connections to the piezoelectric element 134. Electrically connected to the couplings 140 and 142 are leads 144 and 146, preferably in the form of tungsten filled vias, for connecting the piezoelectric element 134 to the circuitry in the open-top receptacle 112 and exterior circuitry, and specifically the IC 126 and capacitors 128 and 130. The coupling 140 includes a wraparound section 141 electrically connecting an outwardly facing electrode 164 (top electrode) of the piezoelectric element 134 with lead 144. Similarly, the coupling 142 electrically connects an inwardly facing electrode 162 (bottom electrode facing the platform 102) with lead 146 in FIG. 2.

Once the TCXO package 100 has been assembled, the package 100 is suitably coupled to a circuit board for use in an electronic device. The planar end portion 122 is configured to facilitate placement on a circuit board or suitable substrate. The plurality of contacts 124 are suitably connected to respective leads 120, and to metallized paths on a circuit board for connection to an electrical device. Adjacent and perpendicular to the plurality of contacts 124, are respective grooves or castellations 148 on an exterior portion 150 of the upper sidewalls 108. Preferably, these castellations 148 are semicircular for easy inspection of the electrical connections (typically solder) between the contacts 124 to a circuit board.

The instant invention also includes a method to simplify the coupling of components to packages for use in making oscillators, and is particularly adapted to facilitating mass production of temperature compensated crystal oscillators.

In its simplest form, the instant method of coupling components to a double-sided oscillator package, comprises the steps of: providing a package 100 having an open-bottom receptacle 114; mounting and hermetically sealing a piezoelectric element 134 in the open-bottom receptacle 114; and coupling electronic components to the package.

This method and structure provides an isolation means for minimizing cross-contamination of the components on each side of the package 100. More particularly, the package 100 is configured to substantially minimize contamination from the electronic components in the open-top receptacle 112, such as the IC 126 and capacitors 128 and 130 and associated solder and flux, etc. from the piezoelectric element 134 in the open-bottom receptacle 114. If contamination occurs, the frequency stability of the piezoelectric element 134 can be adversely affected.

Another advantage of the package 100 and method is that during the process of tuning, typically additional metallization is added to the outwardly facing electrode 164 of the piezoelectric element 134. The possibility of unwanted metal contacting and adversely affecting the components in the open-top receptacle 112 is minimized, because these components are isolated on the other side of platform 102 and typically, have not even been coupled to the package 100 until the tuning step has been completed.

In a preferred embodiment, the method involves: providing a package 100 having an open-top receptacle 112 and an open-bottom receptacle 114; mounting a piezoelectric element 134 in the open-bottom receptacle 114; frequency tuning the piezoelectric element 134; hermetically sealing the piezoelectric element 134 in the open-bottom receptacle 114; and coupling electronic components to the open-top receptacle 112.

Advantageously, the open-top receptacle 112 includes accessible conductive paths 152 and 154 for actuating the piezoelectric element 134 during the frequency tuning step, whereby metal is added to the outwardly facing electrode 164, for example, before hermetically sealing in the open-bottom receptacle 114. The package 100 construction minimizes the possibility of contamination to the IC 126, chip capacitors 128 and 130, and pads 152 and 154 during tuning, since these components are substantially isolated from the piezoelectric element 134 by platform 102 and sidewalls 108 and 110.

In a preferred embodiment, the method includes the following: 1) A double-sided TCXO package 100 is provided. The package 100 includes a multi-layer ceramic portion defining the upper sidewalls 108 and a metal brazed ring defining the lower sidewalls 110, coupled to the platform 102. 2) A quartz crystal is placed in the open-bottom receptacle 114 when the package is facing upwardly and is suitably attached to the central portion 104. 3) The quartz crystal is frequency tuned by mass loading of the crystal, while actuating the quartz crystal through the metal pads 152 and 154 on the other side, accessible to the open-top receptacle 112 in the central portion 104 of the package 100. 4) The crystal is then hermetically sealed with a metal cover 116 by utilizing a parallel seam weld to couple the lower-edge portion 136 of the lower sidewalls 110 with the cover 116. The crystal portion of the fabrication process is now complete. 5) The electronic components are placed in the open-top receptacle 112 and suitably attached by dispensing solder on the platform 102 for coupling the chip capacitors 128 and 130. The solder is tacky and suitably holds the components until reflow. Next, flux is dispensed in proximity to and under the IC 126 area. A flip-chip IC with solder bumps is aligned and placed in the central portion 104 of the platform 102. The parts are then solder reflowed. An organic underfill is dispensed such that it flows underneath the IC 126 and substantially environmentally protects the IC 126. 6) Thereafter, the TCXO package 100 is sent for final electrical set up and testing. Thereafter, a customer will typically solder reflow the planar portion 122 to a circuit board suitably connecting each of the contacts 124 to a suitable electrical connection for use in electronic equipment. This method can simplify mounting and assembly of components.

Although the present invention has been described with reference to certain preferred embodiments, numerous modifications and variations can be made by those skilled in the art without departing from the novel spirit and scope of this invention.

What is claimed is:

1. A double-sided temperature compensated oscillator package, comprising:

a platform including a central portion and an outer portion;

sidewalls extending substantially upwardly and substantially downwardly from the outer portion of the platform, the upwardly extending sidewalls terminate at a surface mountable end portion, the surface mountable end portion includes a plurality of contacts for connection to an electrical device;

the upwardly extending sidewalls and the platform forming an open-top receptacle adapted to receive electronic components and the downwardly extending sidewalls and the platform forming an open-bottom receptacle adapted to receive at least one piezoelectric component;

a cover coupled with the open-bottom receptacle defining a hermetic environment;

the open-top receptacle includes electronic components comprising at least one flip chip integrated circuit and a capacitor; and the open-bottom receptacle includes a piezoelectric component, whereby a surface mountable temperature compensated package is defined.

2. The package of claim 1, wherein the open-top receptacle comprises a co-fired ceramic material and the downwardly extending walls comprise an alloy of nickel, iron and cobalt, and wherein the upwardly extending sidewalls and the platform include a plurality of internal electrical leads.

3. The package of claim 1, wherein the platform, the upwardly extending sidewalls and the downwardly extending sidewalls comprise materials having substantially similar thermal expansion coefficients.

4. The package of claim 1, wherein the surface mountable end portion includes a substantially planar surface having a plurality of electrical contacts.

5. The package of claim 1, further comprising a plurality of internal leads extending from the central portion to an end portion of the upwardly extending sidewalls, the end portion including a plurality of electrical contacts coupled to the internal leads.

6. The package of claim 1, wherein the open-bottom receptacle includes the piezoelectric component and at least one electronic component.

7. The package of claim 1, wherein the open-top receptacle includes the flip chip integrated circuit with an organic underfill.

8. The package of claim 1, wherein the cover is coupled to the open-bottom receptacle by a seam weld or solder seal.

9. A double-sided temperature compensated oscillator package, comprising:

a platform including a central portion and an outer portion;

sidewalls extending substantially upwardly and substantially downwardly from the outer portion of the platform;

the upwardly extending sidewalls and the platform forming an open-top receptacle and the downwardly extending sidewalls and the platform forming an open-bottom receptacle;

a cover couplable with the open-bottom receptacle to provide a hermetic seal;

the open-top receptacle including electronic components including at least one flip chip integrated circuit and a capacitor; and the open-bottom receptacle including a piezoelectric component, whereby a surface mountable temperature compensated package is defined.

10. A double-sided temperature compensated oscillator package, comprising:

a platform including a central portion and an outer portion;

sidewalls extending substantially upwardly and substantially downwardly from the outer portion of the platform;

the upwardly extending Sidewalls and the platform forming an open-top receptacle and the downwardly extending sidewalls and the platform forming an open-bottom receptacle;

a cover couplable with the open-bottom receptacle to provide a hermetic seal;

the open-top receptacle including at least one electronic component including at least one integrated circuit; and the open-bottom receptacle including a piezoelectric component whereby a surface mountable temperature compensated package is defined, wherein the electronic component includes a flip chip integrated circuit and two chip capacitors.

11. The package of claim 10, further comprising conductive paths extending from a central portion of the platform to an end portion of the upwardly extending sidewalls being electrically couplable to electrical signals for activation.

12. The package of claim 10, wherein the cover is metal and is electrically coupled to a ground portion of the IC.

* * * * *